(12) United States Patent
Piwczyk et al.

(10) Patent No.: US 9,214,368 B2
(45) Date of Patent: Dec. 15, 2015

(54) LASER DIODE ARRAY WITH FIBER OPTIC TERMINATION FOR SURFACE TREATMENT OF MATERIALS

(75) Inventors: Bernhard Piwczyk, Dunbarton, NH (US); William Shiner, Millbury, MA (US)

(73) Assignee: IPG PHOTONICS CORPORATION, Oxford, MA (US)

( * ) Notice: Subject to any disclaimer, the term of this patent is extended or adjusted under 35 U.S.C. 154(b) by 945 days.

(21) Appl. No.: 13/192,027

(22) Filed: Jul. 27, 2011

(65) Prior Publication Data

US 2013/0025325 A1    Jan. 31, 2013

(51) Int. Cl.
  *B23K 26/00* (2014.01)
  *H01L 21/67* (2006.01)

(52) U.S. Cl.
  CPC .......... *H01L 21/67115* (2013.01); *B23K 26/00* (2013.01)

(58) Field of Classification Search
  CPC   G02B 19/0014; G02B 19/0057; H01S 5/005; H01S 5/4031; H01S 5/4068
  USPC ............. 219/121.61–121.72, 121.76, 121.77; 372/9–32
  See application file for complete search history.

(56) References Cited

U.S. PATENT DOCUMENTS

| | | | | |
|---|---|---|---|---|
| 4,972,427 A * | 11/1990 | Streifer et al. | | 372/92 |
| 5,323,411 A * | 6/1994 | Shirasaka et al. | | 372/50.21 |
| 5,513,201 A * | 4/1996 | Yamaguchi et al. | | 372/75 |
| 5,594,752 A * | 1/1997 | Endriz | | 347/241 |
| 5,619,245 A * | 4/1997 | Kessler et al. | | 347/241 |
| 5,745,153 A * | 4/1998 | Kessler et al. | | 347/241 |
| 5,793,783 A * | 8/1998 | Endriz | | 372/31 |
| 5,923,475 A * | 7/1999 | Kurtz et al. | | 359/619 |
| 6,813,069 B2 * | 11/2004 | Rice et al. | | 359/349 |
| 6,822,985 B2 * | 11/2004 | Tsunekane et al. | | 372/29.021 |
| 6,923,374 B2 * | 8/2005 | Knowles et al. | | 235/454 |
| 6,934,014 B1 * | 8/2005 | Kleinhuber | | 356/72 |
| 6,995,912 B2 * | 2/2006 | Okazaki et al. | | 359/619 |
| 7,068,690 B2 * | 6/2006 | Okazaki et al. | | 372/36 |
| 7,440,483 B2 * | 10/2008 | Kireev et al. | | 372/44.01 |
| 7,538,295 B2 * | 5/2009 | Amesbury et al. | | 219/121.63 |
| 7,565,049 B2 * | 7/2009 | Sugita et al. | | 385/133 |
| 7,616,330 B2 * | 11/2009 | Neal et al. | | 356/625 |
| 7,653,115 B2 * | 1/2010 | Yamaguchi et al. | | 372/101 |
| 7,940,465 B2 * | 5/2011 | Corem et al. | | 359/641 |
| 7,961,771 B2 * | 6/2011 | Manni | | 372/70 |
| 2002/0195496 A1* | 12/2002 | Tsikos et al. | | 235/462.01 |
| 2004/0091013 A1* | 5/2004 | Yamaguchi et al. | | 372/108 |

(Continued)

*Primary Examiner* — David Angwin
*Assistant Examiner* — Lawrence Samuels
(74) *Attorney, Agent, or Firm* — Timothy J. King, Esq.; Yuri Kateshov, Esq.

(57) ABSTRACT

Individually operable laser diodes in an array are associated with optical fibers for treatment of a material. Each laser diode has a generally Gaussian or similar profile. A guide block receives optical fiber terminal distal ends and enables irradiation of a surface for treatment with overlapping profiles. A control system controls individual laser diodes to achieve desired illumination profiles for a given process. The process is performed in a suitable environment which may include a vacuum system, controlled gaseous environment, or in a doping medium such as a surface coating or even a liquid. Optional relay optics interposed between the terminal distal ends and the treatment material allows distant relaying and reimaging. An optical isolator assembly may be interposed between the relay optics and the treatment material. The system and related methods allow direct irradiation from laser diodes to treat materials.

11 Claims, 4 Drawing Sheets

(56) References Cited

U.S. PATENT DOCUMENTS

| | | | |
|---|---|---|---|
| 2004/0145801 A1* | 7/2004 | Rice et al. ............... 359/349 |
| 2006/0045144 A1* | 3/2006 | Karlsen et al. ............ 372/9 |
| 2006/0237401 A1* | 10/2006 | Amesbury et al. ....... 219/121.63 |
| 2006/0256832 A1* | 11/2006 | Volodin et al. ............ 372/102 |
| 2006/0291520 A1* | 12/2006 | DePriest et al. ........... 372/92 |
| 2007/0064754 A1* | 3/2007 | Zheng et al. ............. 372/43.01 |
| 2007/0153392 A1* | 7/2007 | Reynolds et al. .......... 359/619 |
| 2008/0030867 A1* | 2/2008 | Corem et al. ............. 359/641 |
| 2009/0159820 A1* | 6/2009 | Bartoschewski .......... 250/505.1 |
| 2010/0086001 A1* | 4/2010 | Manni ..................... 372/66 |
| 2010/0149222 A1* | 6/2010 | Welford et al. ........... 345/690 |
| 2011/0063701 A1* | 3/2011 | Yankov ................... 359/15 |

* cited by examiner

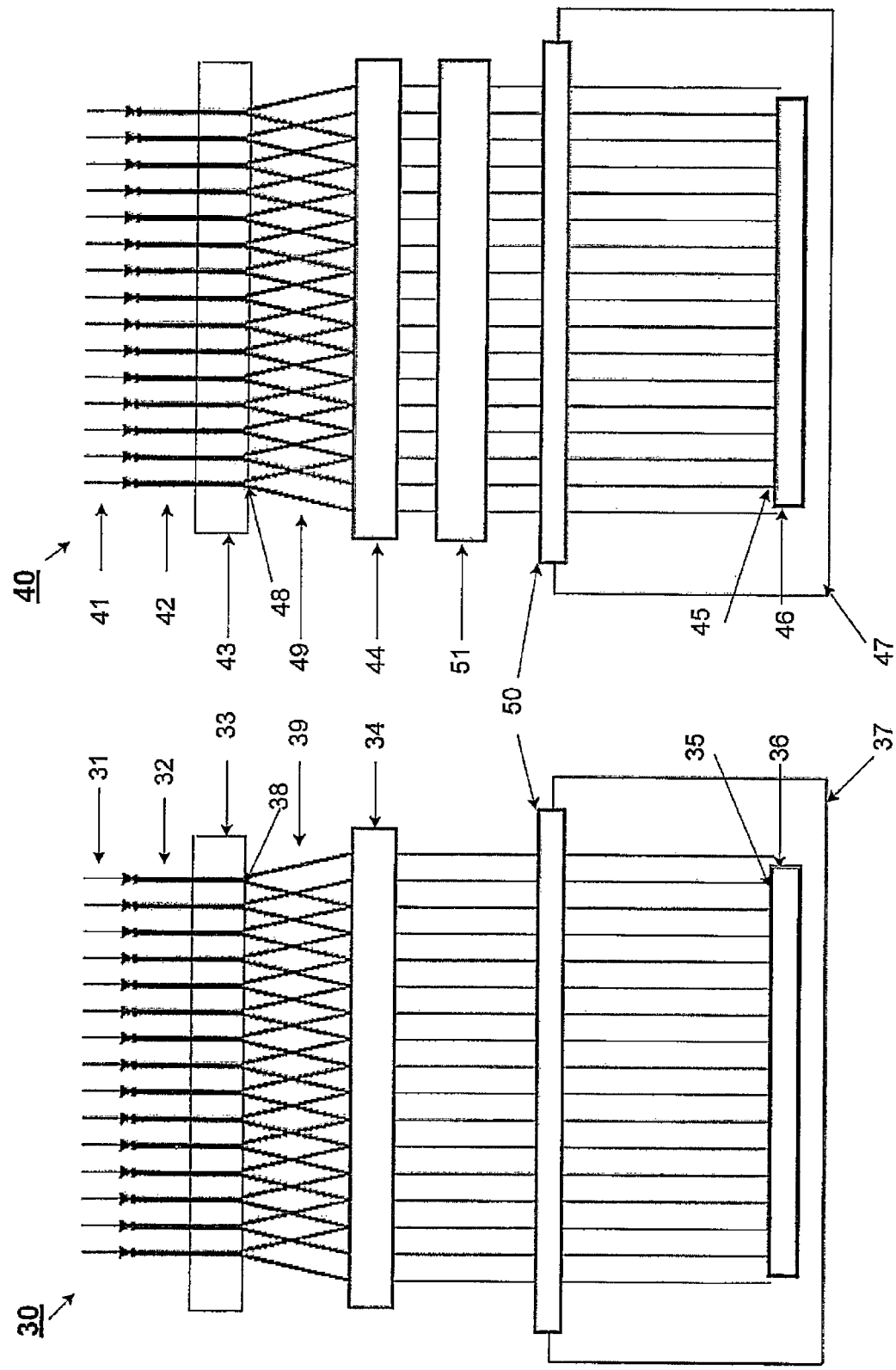

LASER DIODE ARRAY WITH FIBER OPTIC TERMINATION FOR SURFACE TREATMENT OF MATERIALS

BACKGROUND OF THE INVENTION

1. Field of the Invention

The present invention relates to an apparatus and method for surface treatment of materials using intense direct irradiation from individually controllable high power laser diodes. More particularly, the present invention provides a laser diode array with fiber optic termination and a method enabling alteration of material properties near the surface or through the entire body of a material in a target region.

2. Description of the Related Art

Industrial applications of lasers involve exposing material surfaces to cause material property changes or modifications. These include applications such as hardening of metals, laser annealing, or gas immersion doping.

Conventionally, an incident laser beam impinges on only a tiny part of a surface for treatment, for example a wafer, on an incident side at any moment in time. Conventionally, this results in substantial localized thermal gradients. Additionally, conventional laser beam treatments require substantial power, which impacts process economics and efficiencies.

Temporary and rapid heating of a material may occur in air, vacuum, various gaseous environments or involve surface coatings with a variety of materials prior to high intensity radiant exposure to light produced by lasers. Exposure can result in material property changes due to re-crystallization, or different hardness or different electrical properties after such exposure. In general this involves the rapid heating and cooling of the material, and may also involve melting. For example, during the heating and cooling of the material certain molecular or atomic species contained in the ambient gas may be incorporated into the material by diffusion or chemical reaction, resulting in physical property changes of the material such as electrical properties or surface topography.

Accordingly, there is a need for an improved system and method for surface treatment of materials using intense direct irradiation from high power laser diodes. Further, there is also a need to improve process efficiencies during material treatment with laser light.

ASPECTS AND SUMMARY OF THE INVENTION

In response, it is now recognized that the performance of the treatment process can involve irradiation with light emitted from a laser diode array or a laser diode array assembly where the incident radiation intensity stays relatively uniform over a range of spacing at the standard small NA's from the light source (fiber terminations) to a treatment surface. It is also understood that irradiation parameters can now be easily adjusted as function of desired process parameters. Relative cost, repair, and operational efficiencies are improved.

Where specific laser properties such as coherence and short pulse duration are not required, the proposed laser diode array provides distinct advantages, including; greater (two fold-plus) energy efficiency than lasers, less costly (roughly two-fold) operation, and use where large areas need to be exposed or treated.

It is also recognized that different laser diodes made from such semiconductor materials such as GaAs or InP (or other materials) can produce intense, nearly monochromatic, radiation having different absorption or "coupling efficiencies" for different materials. It is also recognized that diode characteristics can be selected for optimum coupling efficiency for a given material for treatment.

It is also recognized that the invention minimizes optics complexity and enables optional use for preheating and annealing or diffusion using the same radiation source. It is finally also recognized that high energy efficiency is realized. Laser diodes have an approximately 60% energy conversion efficiency vs. the efficiency of fiber lasers being approximately 30%, such that the improvement (change) of efficiency is approximately 100%.

An aspect of the present invention provides a two-dimensional laser diode array for operably producing homogenous illumination over a large area for materials processing. While more complex, another optional aspect of the present invention provides for a two-dimensional array of beam spots using individual lenses for each diode in the array for operative parallel processing to improve throughput and detailed control.

In the present invention each diode in an associated array is associated with one or more respective optical fibers. Preferably the laser diodes have a generally Gaussian or similar profile and are selected by a desired wavelength light output to match target material absorption characteristics. A guide block operably receives the optical fibers proximate at least a distal end thereof and enables irradiation of a surface for treatment.

The laser diode array allows selection of individual laser diodes so that diode characteristics can be selected for optimal coupling efficiency for a given material to be treated. Each diode in a given array can be driven individually and at different power levels thereby enabling adjustment in the intensity profile on the plane exposed. This enables operable management of the intensity profile proximate the edges of a work piece. An optional motion system enables controlled exposure of a large area for treatment using the laser diode array. The process is performed in a suitable environment which may include a vacuum system, a controlled gaseous environment, an optional doping medium or any other environment including a liquid. The apparatus and related methods allow intense direct irradiation from laser diodes to alter material properties near a surface of, or through the entire body of, a material being treated with improved process efficiency.

It is another alternative aspect of the present invention to provide, optionally, a laser diode array and fiber optic deliver having a linear or two dimensional process, for use in heat treating, hardening, annealing, and/or diffusion from solid or gas immersion (GILD).

It is another alternative aspect of the present invention to provide an operable motion system to enable exposure of large surfaces using a laser diode array.

It is another alternative aspect of the present invention to adaptively provide a window interposed between a laser diode array fiber terminations and a surface being treated.

It is another alternative aspect of the present invention to provide an optcal isolation system to control or prevent back reflection from the diode array back to the fiber termination or diode itself. This isolator may include a Faraday rotation medium, polarization dependent isolator, or other optical elements.

It is another alternative aspect of the present invention to optionally provide an operable relay lens system interposed between the fiber terminations and the surface being treated. This relay lens system is operable to allow the diode array, fibers, and fiber terminations to be positioned remote from and in a different environment from the surface being treated.

It is also another aspect of the present invention that the apparatus or system or method may involve modulation of light output of the individual laser diodes in the array by electronically overdriving, underdriving, pulsing, or otherwise operably controlling the laser diode array or individual diodes therein to vary the exposure on the surface to be treated, thus enabling generation of selective emitters for solar cells or other specialty products.

In a basic embodiment of the present invention a specific implementation is provided having a two-dimensional array of equally spaced optical fibers delivering light from high power laser diodes. Light propagates from the end of each fiber and spreads in a generally Gaussian distribution depending on the numerical aperture (NA) of the fiber. Close to the fiber ends a number of equally spaced light spots can be observed on a plane, or screen, relative to the array of fiber ends spaced a distance away from the plane of the sources of light. The illumination intensity within each spot will be axially symmetric and Gaussian with the highest illumination intensity at the center of each circular area or spot. Necessarily, the diameter of the illuminated spot is a function of the distance from the fiber end and the NA (numerical aperture) of the fiber. As a distance d, between the sources and the screen, is increased the illuminated spots increase in size but the distance between the spots remains constant. As the distance is further increased the illuminated areas begin to overlap until the illumination between the individual spots is such that the overlap is at FWHM (full width at half maximum). Under this condition a central region parallel to a row of fiber light sources is uniformly illuminated (with the exception of the ends where there is no possibility of further overlap). The intensity distribution in the direction orthogonal to the linear array of light sources is essentially Gaussian. If the distance is increased even further the illumination intensity decreases gradually but the illumination along the length aligned with the array remains essentially uniform but begins to fall of gradually at the ends of the area illuminated, until the illuminated area assumes a Gaussian distribution in both directions.

An alternative embodiment can provide the fiber terminations in a staggered or off-set two-dimensional array tailored to a required treatment profile. In a further alternative embodiment, the fiber terminations may also be provided in a three-dimensional profile effective to treat a non-linear curved surface.

An embodiment of the present invention provides laser diodes operating at wavelengths shorter than about 1.07 microns so that an absorption depth is therefore shorter (providing more effective surface heating) when compared to a Ytterbium fiber or YAG laser operating at 1.06 microns wavelength.

The above and other aspects, features and advantages of the present invention will become apparent from the following description read in conjunction with the accompanying drawings, in which like reference numerals designate the same elements.

BRIEF DESCRIPTION OF THE DRAWINGS

FIG. 6 is an illustrative schematic of a laser diode array and a relay lens system.

FIG. 7 is an illustrative schematic of a laser diode array with a relay lens system and an optical isolator assembly.

DETAILED DESCRIPTION OF THE PREFERRED EMBODIMENTS

Figure 1:
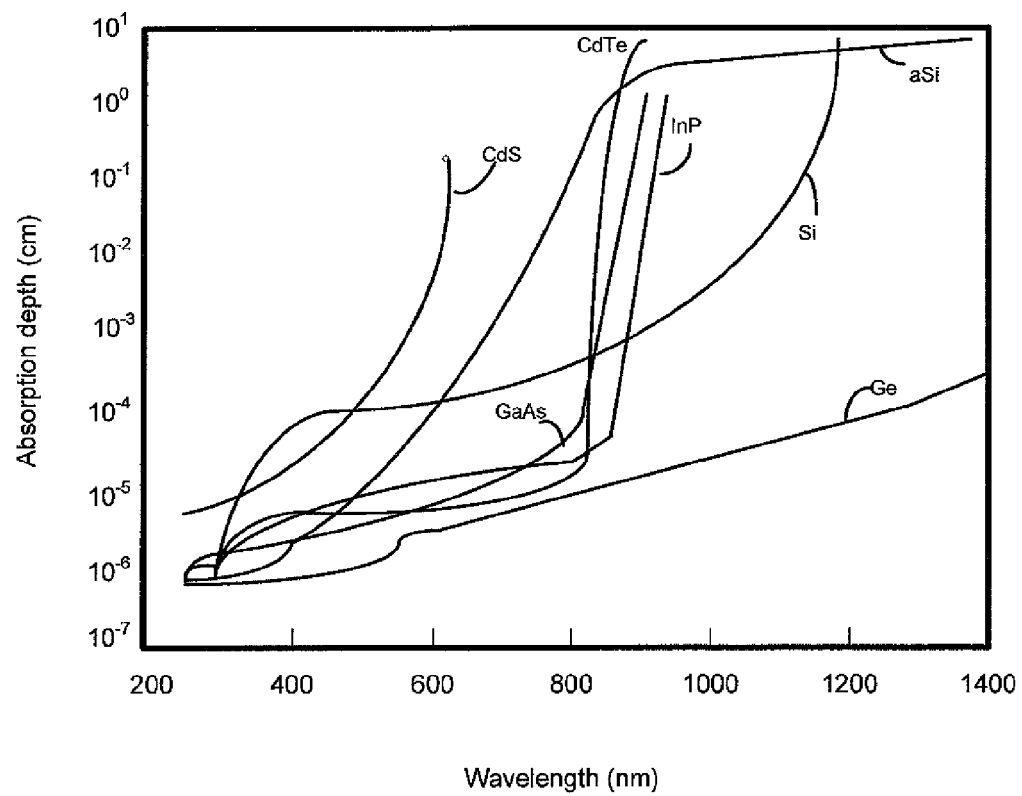
FIG. 1 is a graph of absorption depth vs. wavelength for different semiconductor materials.

Reference will now be made in detail to embodiments of the invention. Wherever possible, same or similar reference numerals are used in the drawings and the description to refer to the same or like parts or steps. The drawings are in simplified form and are not to precise scale. For purposes of convenience and clarity only, directional (up/down, etc.) or motional (forward/back, etc.) terms may be used with respect to the drawings. These and similar directional terms should not be construed to limit the scope of the invention in any manner.

One of the present inventions is laser diode annealing of silicon wafers for solar cell manufacturing. Here the silicon wafer surface needs to be heated so that the surface temperature exceeds the melting point of Si (Silicon). Tests have shown that CW laser radiation with a wavelength of 1.070-1.080 μm (microns) at an irradiance in the region of 500-2000 W/cm2 and exposures of 50-200 J/cm2 can be used to melt the surface of a Si wafer.

The time required to achieve surface melting is a function of the irradiance. The higher the irradiance the less energy is required to achieve surface melting and the shorter the exposure time becomes. Surface melting or annealing is achieved with a fluence of between 70-100 J/cm2. Since the wafer is heated during exposure, losses are incurred (due to reflection, transmission, conduction and re-radiation), these losses become increasingly significant at lower irradiance to the point where no surface melting occurs when the losses approach the energy input to the wafer.

Referring now to FIG. 1, a graph depicts absorption depth vs. wavelength for different semiconductor materials. The absorption depth for Si changes rapidly in the wavelength region of 1.0 μm (as shown). The dependence of absorption coefficient on wavelength causes different wavelengths to penetrate different distances into a semiconductor before most of the light is absorbed. The absorption depth is given by the inverse of the absorption coefficient, or $\alpha^{-1}$. As can be seen in FIG. 1, the absorption depth is a useful parameter which gives the distance into the material at which the light drops to about 36% of its original intensity, or has dropped by a factor of 1/e. Since high energy light or short wavelength light has a large absorption coefficient, it is absorbed in a short distance.

Further, the surface topography of a treatment surface (for example, a Si wafer) also influences the required irradiance since polished wafers have a high reflectivity and therefore higher losses. In one example, in order to achieve the required irradiance, approximately 160 100 W laser diodes with fibers arranged in a linear array (as will be discussed in FIGS. 3-5) are desired for a combined output of 16 kW. Conventionally, fiber lasers of this output power level are expensive but have a wall plug efficiency of 30%. Thus, in this embodiment, the same or even better results can be achieved using the same laser diodes that are used to pump a fiber laser. Since the laser diodes used for pumping of the fiber laser emit at wavelengths of 0.915-0.980 µm and the absorption depth is decreased by about 30%, from 100 µm to 70 µm (as shown in FIG. 1) when compared to the 1.06 µm wavelength of the ytterbium (Yb) fiber laser. The light output from the laser diode source is absorbed by silicon much more efficiently. In addition the wall plug efficiency of the laser diode compared to the laser is approximately 60% when compared to 30% of the fiber laser.

Figure 2:
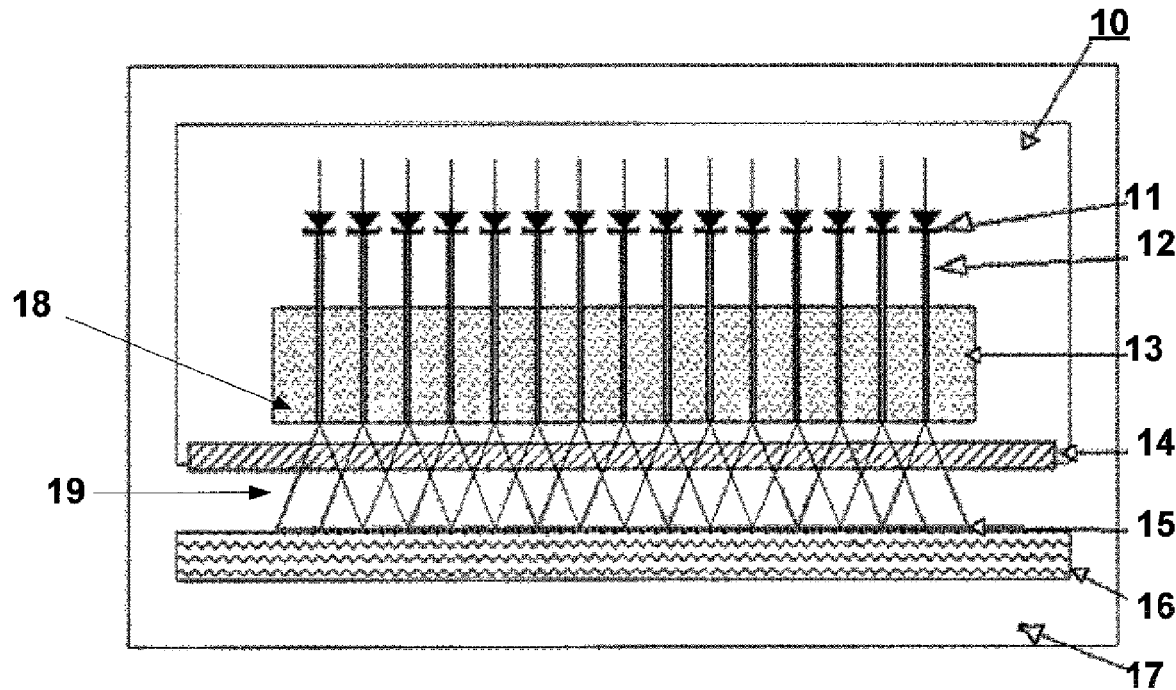
FIG. 2 is an illustrative schematic of a laser diode array with fiber optic beam delivery and wafer exposure.

Referring additionally to FIG. 2, a proposed diode array system 10 is mounted, in this alternative and optional embodiment, a vacuum chamber 17. An array of independent laser diodes 11 is provided with respective optical fibers 12, which pass through a block 13. Fiber terminal ends or fiber terminations 18 are noted as fibers 12 terminate at the end of block 13.

Block 13 provides fiber support and is shown as a metal block, but may be made from any suitable material, including ceramics, glasses, metals or combinations thereof, including for example silicone (Si). Block 13 is shown optionally in a monolithic form with spaced through holes, but may be adapted to a non-monolithic form (not shown) formed within the spirit and scope of this invention and being operative to provide rigid support to optical fibers 12 proximate terminal ends 18. For example, block 13 may be formed in two or more parts, wherein partial grooves (also not shown) are formed spaced apart on opposing inner faces such that the partial grooves receive respective fibers 12 when the faces are placed together.

System 10 is shown treating a wafer 15 on an optional electrostatic chuck 16. Optionally, a protective window 14 is interposed between block 13 and wafer 15. Spreading from fiber terminations 18 are illustrative profiles 19 (representing a generally Gaussian energy distribution) arrayed along a two-dimensional plane onto wafer 15 (as a 'profile receiving member').

It will be understood, that block 13 may additionally include cooling or heating features, sensors (motion, thermal, vibratory, etc.), or other operative system management features within the scope of this invention.

Figure 3:
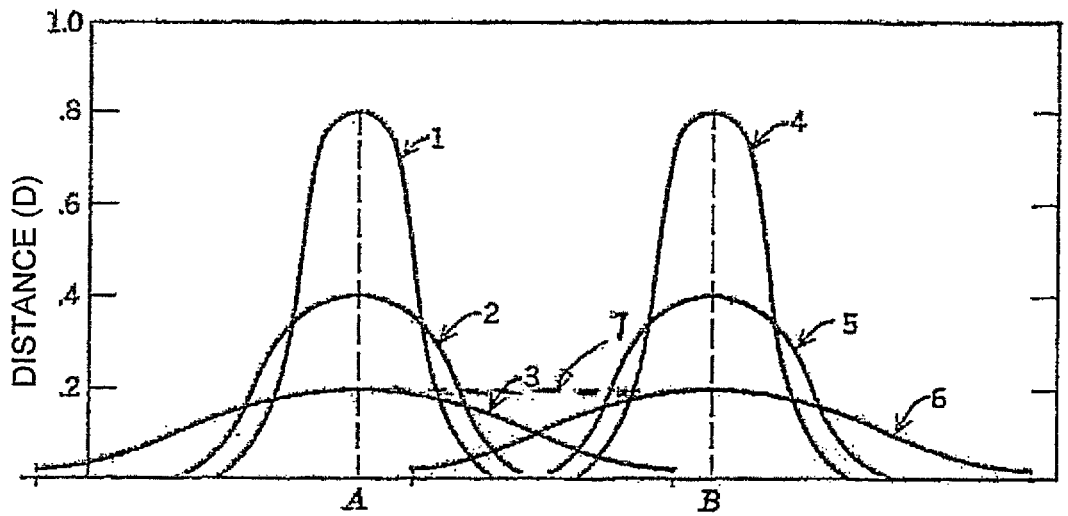
FIG. 3 is an exemplary graph of Gaussian irradiation from two adjacent laser diode fiber sources in close proximity to a surface.

Additionally referring now to FIG. 3, a distance D between the fiber terminations 18 and the treatment surface is adjustable during operations, and is also dictated by the power output of respective individual laser diodes, the coupling efficiency between the laser diode and the output fiber, the target irradiance required and the need for homogeneous irradiation along the direction of the diode array fibers, at the target surface, for optimal efficiency.

The latter condition is met when the generally Gaussian energy distribution from any single light source from terminal end 18 is overlapped with the generally Gaussian energy distribution from the next adjacent fiber termination 18 in Block 13, so that each Gaussian distribution overlaps at the "full width at half maximum" (FWHM) point.

This is illustrated specifically in FIG. 3, where curves 1 and 4 represent the energy distribution of two adjacent light sources or fiber terminations (no overlap condition) in positions centers A, B, and curves 2 and 5 when the distance is increased (still no overlap but a broader and decreased surface irradiation) and finally, when the distance is increased further as indicated by curves 3 and 6 when the irradiated areas overlap at the FWHM condition when the sum of the irradiated areas results in a respective uniform irradiance in one axis on the wafer surface as shown as curve 7 (dotted line). It is understood, that this uniform irradiance curve 7 extends along laser diode array 11 until reaching the ends and extends preferably there beyond.

Note that the illuminated area increases with increasing distance from the illuminated flat surface of wafer 15 and the relative irradiance decreases but the total or integral irradiance remains constant.

Assuming, as a non-limiting example, the use of 100 W (measured at the fiber termination) laser diodes in a linear array, a target irradiance of 1,000 W/cm2 and a numerical aperture (NA) of 0.13, the distance between the fiber terminations and the wafer surface to achieve the required irradiance can be calculated:

Since each diode emits sufficient energy to irradiate 0.1 cm² the spacing between fiber terminations is 1.0 mm.

D=distance from fiber termination to wafer surface (cm)
d=distance between fibers=0.1 cm (in this embodiment)
θ=half angle as determined by NA $$D=d/\sin\theta=1\text{ mm}/NA=1/0.13=7.69\text{ mm}$$

This is a relatively short working distance and results, in this embodiment, in the requirement of installing the laser diode array system 10 and the required scanning system (discussed later, preferably a single axis scanning system) inside vacuum chamber 17 for treating (e.g., annealing) of wafers after ion implantation (FIG. 2). The same calculation applies for a GILD process. This distance is sufficient to insert a protective window 14, being for example 2-3 mm in thickness, between fiber terminations 18 of laser diode array 10 and wafer 15 surface as shown in FIG. 2. However, as will be discussed later in alternative embodiments, additional optics and an optical relay system allows an alternative embodiment to relay and reimage the output of the laser diode array (LDA) a great distance from the treatment surface sufficient so that the LDA 11, fibers 12, and block 13 may be positioned outside of vacuum chamber 17, or the output optically split to treat multiple surfaces simultaneously.

As an example of the proposed invention, a single scan exposure of a standard 15.4 cm×15.4 cm solar cell wafer therefore requires a linear array of 154 diodes and probably 160, or more, to add a margin (not shown) at the ends of the illuminated area to cover the full treatment surface for a total output of 16 kW of power. Experiments indicate that such a system is capable of exposing a single wafer within 1-2 seconds. The increased absorption of about 30% as shown in FIG. 1 is due to the somewhat shorter wavelength of the diode emission when compared to the conventional Ytterbium (Yb) fiber laser could result in the potential use of 60 W laser diodes instead of the more costly 100 W diodes. As a result, the proposed system having a laser diode array (LDA) assembly can be rapidly changed out or modified as may be needed to suit a particular purpose within the scope and spirit of the benefits of the present invention.

Figure 4:
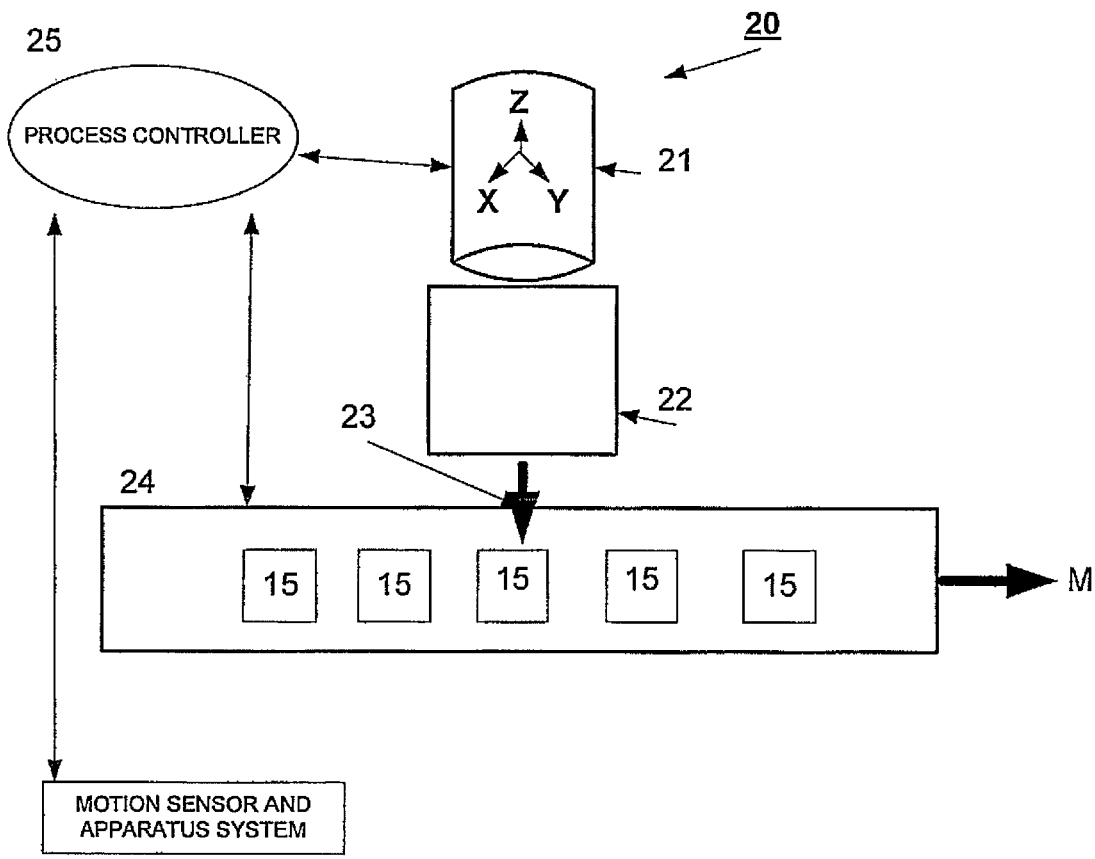
FIG. 4 is an exemplary motion system for a laser diode array with fiber optic termination operable for surface treatment of materials.

Referring additionally now to FIG. 4, an exemplary optional control and motion system 20 is illustrated enabling a treatment of respective wafers 15 on a motion system 24 operative to move along a direction M with respect to a laser diode array system 22 responsive to a motional actuator scanning system illustrated at 21. An overall process controller 25 is in communication with a sensor (motion, thermal etc.) and optional apparatus feedback system 26 as well as control and motion system 20. Sensor and optional apparatus feedback system 26 enables easily process control feed back in various ways. This process control may be achieved by providing multiple process signals to feedback system 26, controlled interaction with stored processing programs, data storage, and thus process controller 25 and system 20 and array system 22.

These process signals may be achieved individually by, or by an integrated process of any of the following: (a) sensing the reflected radiation alone or as an indication of a change of radiation absorption or surface roughness, (b) sensing the substrate temperature by way of pyrometry or an infra red (IR) Camera, and optionally (c) by sensing the radiation output of the diode array. Thus, while FIG. 4 is exemplary, it will be understood that control and motion system 20 and in turn laser diode array (LDA) system 22 may include any operative mechanisms (mechanical, pneumatic, hydraulic, electronic, wavelength selection, intensity, duration, robotic, etc.) effective to achieve an exposure via a generally Gaussian profile 23 (shown as an arrow) over optionally large surfaces using the mobile laser diode array or multiple surfaces 15, or a via a remote relay system (discussed later). Commonly the feedback signal would be employed as feedback to the diode array to adjust the output of individual diodes or the entire array. As a non-limiting example, this adjustment may include modulation of the light output of the laser diode array by electronically overdriving or pulsing the array or individual diodes within the array to vary the exposure spatially on the surface.

It will also be understood that process control feed back is enabled by wireless or wired connections. Further, using control and motion system 20, allows linear laser diode array 11 to move in at least one direction, and optionally multiple directions (X, Y, or Z directions) relative to the treatment surface as driven by process control.

Control and motion system 20, and optionally process controller 25 and/or motion sensor and apparatus system 26 may include computerized process units (CPUs), containing an operational process control programs, memory or data storage systems, and computerized process control (all not shown) is in operative communication with laser diode array 11.

Additionally, it will be understood, that this motion direction M provides a leading edge (shown) and a trailing edge (shown) and side edges (shown) for wafers 15. It is understood that the combined curves overlap (curve 7 FIG. 3) and optionally extends the width of wafer 15 during a treatment. In this manner, there is a full scanning over the complete wafer to manage the edge and the body temperature gradients during processing. It is further understood that the use of the proposed array of individually driven diodes allows production of substantially homogenous illumination over a wide and large area or optionally an array of beam spots using individual lenses for each diode in the array for parallel processing to improve throughput.

Figure 5A:
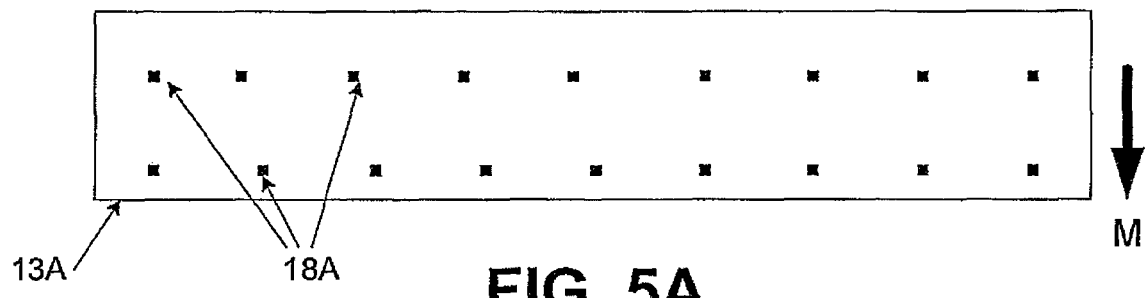
FIGS. 5A, 5B, and 5C represent alternative illustrative laser diode array arrangements relative to a processing direction.
Figure 5B:
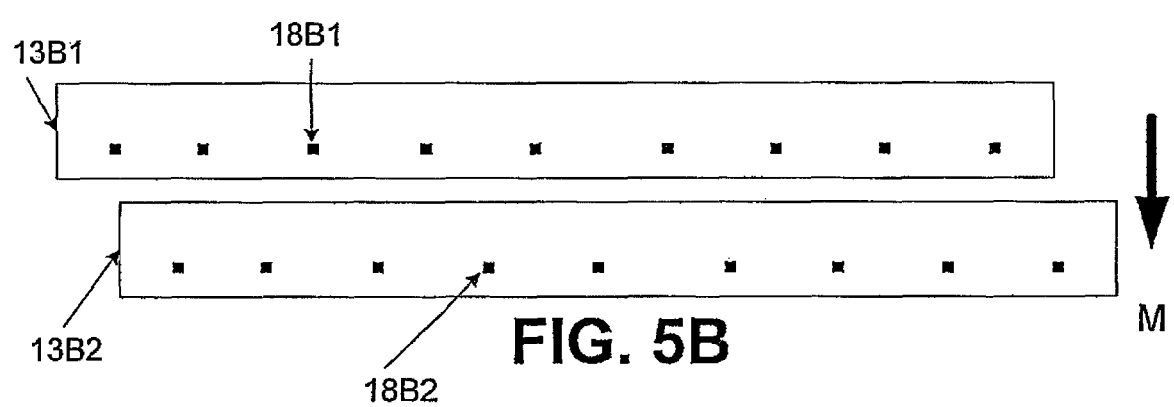
Figure 5C:
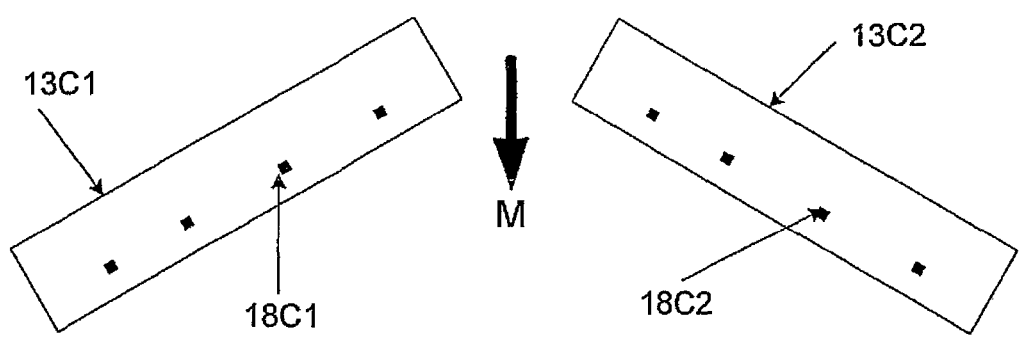

Referring now to FIGS. 5A, 5B, and 5C, alternative arrangements of blocks 13A, 13B1, 13B2, 13C1 and 13C2 are presented relative to a processing direction in the embodiment noted in FIG. 4. In these illustrations, fiber terminal ends 18A, 18B1, 18B2, 18C1, and 18C2 are shown in alternative positions confirming that the present invention enables different two-dimensional and even three-dimensional laser diode arrays to adapt to a desired treatment process.

For example, In FIG. 2, fiber terminal ends 18 are arrayed in a single two dimensional row. In FIG. 5A, fiber terminal ends 18A are shown in spaced-apart parallel two rows, thereby providing greater coverage. In FIG. 5B, two separate blocks 13131 and 13B2 are off-set allowing respective fiber terminal ends 18B1, 18B2 to be off set thereby enabling a staggered or three-dimensional arrangement. For example, the fiber in each block is approximately 150 µm in diameter and includes cladding, therefore the fiber-spacing in blocks 13 (FIG. 2) may be as small as 1 mm apart or less. Therefore, by adapting one or more blocks 13 a desired fiber spacing can be achieved. A further alternative embodiment is in FIG. 5C notes that blocks 13C1, 13C2 may be either shaped three-dimensionally or positioned three-dimensionally regarding a direction and a surface for treating.

Referring now to FIGS. 6 and 7, two alternative embodiments are proposed respectively as diode array systems 30 and 40. In each system 30, 40, the laser diode arrays 31, 41 (with individually controllable diodes as discussed herein), respective fiber optics 32, 42, and blocks 33, 43 are remote from respective vacuum chambers 37, 47 housing from respective wafers 35, 45 on respective electrostatic chucks 36, 46. Vacuum windows 50, 50 enclose each vacuum chamber 37, 47, serve as protective windows, and allow treatment of wafers 35, 45 under various environments.

Systems 30, 40 additionally contain respective relay lens systems 34, 44 which receive the resultant profile outputs of fiber termination ends 38, 48 creating respective illustrative profiles 39, 49 resulting in a substantially Gaussian profile received along respective relay lens systems 34, 44 in a related manner similar to that created in FIG. 2 directly between the treatment wafer 15 and terminal ends 18. Thus, relay lens systems 34, 44 are profile receiving members.

Thus, here, in systems 30, 40, the distance D (FIG. 3) is now noted as between the terminal fiber ends 38, 48, and the relay lens systems 34, 44 (not the treatment surface of wafer 15 as in FIG. 2). Relay lens systems 34, 44 contain interoperable optical components to receive, relay over large distances, and reimage the output of the laser diode arrays 31, 41 distant from chambers 37, 47. In this way relay lens systems 34, 44 would similarly permit manipulation of the relayed output.

As a result of the alternative embodiments in systems 30, 40, laser diode array (LDA's) assemblies 31, 41 and related components are located remotely from the treatment location thereby avoiding the drawbacks associated with the embodiment of system 10, such as narrow spacing and related contamination on protective window 14 (FIG. 2).

Further, it is recognized that back reflection from the treatment surface or down-stream optic components is of concern in particular situations, such that in system 40 (FIG. 6) an optical isolator assembly 51 is interposed between relay lens system 44 and window 50. Optical isolator assembly 51 contains one or more interoperative components effective to control, reduce, or prevent back reflection. Optical isolator assembly 51 optionally includes a Faraday rotator, polarization dependent or independent elements, or other optic- or magneto-optic elements effective to protect system 40 from back reflection.

It will be understood that the alternative embodiments denote target (wafer) member 15, or a relay lens systems 34, 44 as profile receiving members since each receives the overlapping generally Gaussian energy profiles emitted from adjacent fiber terminations. During use, the optional process controller 25, 20, operably allow individual control of laser diodes in the array and the profile. Therefore, for example, the process controller and laser diode array spectrums can be managed proximate the wafer target edges as shown in FIGS. 6 and 7 to avoid over heating.

It will also be understood by those of skill in the art, having studied the present disclosure that the phrases; two-dimensional array, three-dimensional array, diode array, laser diode array, array of laser diodes, or diode array assembly, and related phrases have a unique and specific meaning as used herein, and while used interchangeably will be understood to not include a monolithic laser diode bar (e.g., all laser diodes formed monolithically together and controlled together, preventing individual adjustment, so that if one diode fails the entire bar fails) or other monolithic multi-diode forms.

The present invention employs a laser diode array, etc. with individually mounted laser diodes and operably associated optical fibers, even if linearly or two-dimensionally or three-dimensionally arrayed, which may thus be individually replaced should failure occur. The current invention allows for each individual laser diode in the array to be individually "tuned" or "driven" according to a desired treatment or illumination profile requirement. For example, it is proposed that each individual diode would be selected and manipulated by the control processor (not shown) in control system 20 and adjustable in a digital or analog manner; including, pulsed, modulated, overdriven, underdriven, or otherwise controlled depending upon the system requirements, such as to prevent overheating at an edge of a wafer or reflectivity, or treatment surface. Optionally, diodes will be selected that have the shortest wavelength and maximum power for a given treatment.

It will also be understood, that as used herein the phrases 'being exposed' or 'treating a surface' or 'treating' or 'exposing' or 'illuminating' are understood as the application of irradiative wavelengths on a material, and such treatment may penetrate the full depth of the material or any portion thereof.

It will be understood that the environment proximate that treatment surface is not limited. For example, a vacuum or partial pressure gas environment may be employed via chamber 17. Other environments may be employed without departing from the scope of this invention, including ambient atmosphere, various gaseous environments, and partial vacuum.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A system for surface treatment of a material having a peripheral edge, comprising:
    a plurality of individually controllable laser diodes, each generating a beam with a generally Gaussian profile;
    at least one optical fiber associated with each said laser diode;
        each said optical fiber operative to receive said beam from said laser diode and deliver said beam to a respective fiber termination;
    at least one guide block traversed by said fiber terminations and spaced from said material, wherein no beam shaping elements are mounted between said fiber terminations and material, said one guide block being configured to space said fiber terminations so that said delivered beams overlap to define a resulting beam with a cumulative intensity profile distribution;
    a sensor array operative to detect a parameter which characterizes said cumulative intensity profile distribution, and output a first signal upon the detection;
    a motion controlling system operative to control a motion between said material and fiber terminations and including a motion sensor which is configured to detect said peripheral edge of material and output a second signal upon detecting the edge; and
    a modulation controlling system coupled to said sensor array and to said laser diodes and operative to adjust an output power of each individual laser diode upon receiving said first and second signals to adjust said cumulative intensity profile distribution so as to provide uniform heating of said entire exposed surface of said material including a surface region which is adjacent to said peripheral edge during said motion between said material and said fiber terminations.

2. A system, according to claim 1, wherein: said fiber terminations are spaced at a distance D from said exposed surface such that each said Gaussian profile overlaps with said Gaussian energy profile of an adjacent fiber termination sufficiently that each said Gaussian profile overlaps at a full width at half maximum (FWHM) condition, whereby an intensity distribution along said profile receiving member is essentially Gaussian.

3. A system, according to claim 2, further comprising: a protective window interposed between said fiber terminations and said material for treatment.

4. A system, according to claim 3, wherein: said system, further comprises: one of a vacuum system and a controlled gaseous environment system operative to contain said material for treatment during a use thereof.

5. A system, according to claim 2, further comprising: a relay lens system interposed between said guide block and configured to enable said laser diode array to be substantially remote from said material for treatment.

6. A system, according to claim 5, further comprising: an optical isolator system operatively interposed between said relay lens system and said material for treatment.

7. A system, according to claim 5, wherein: said optical isolator system further comprises: interoperative optical components effective to minimize back reflection from said material for treatment.

8. A system, according to claim 7, wherein: said optical isolator system includes a Faraday isolator component.

9. A system, according to claim 2, wherein: said at least one guide block is formed in at least two parts; each said part being formed of an operatively suitable material; and
    two of said parts having opposed contact faces being shaped to receive portions of respective said fiber terminations prior to an assembly of said guide block whereby, following said assembly said guide block securely supports said fiber terminations.

10. A system, according to claim 1, wherein: said sensor array is configured with one or multiple sensors operative to detect said parameter which is selected from the group consisting of a reflected radiation, change of radiation absorption by the profile receiving member, surface roughness of said profile receiving member, surface temperature and radiation output of the diode array and a combination thereof.

11. A system, according to claim 10, further comprising a feedback loop coupling said sensor array to said modulation controlling system and configured to guide the control signal to said modulation controlling system.

* * * * *